United States Patent
Oida et al.

(10) Patent No.: US 6,291,274 B1
(45) Date of Patent: Sep. 18, 2001

(54) RESIN MOLDED SEMICONDUCTOR DEVICE AND METHOD FOR MANUFACTURING THE SAME

(75) Inventors: Seishi Oida, Kyoto; Yukio Yamaguchi, Shiga; Nobuhiro Suematsu, Kyoto, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/341,918

(22) PCT Filed: Feb. 4, 1998

(86) PCT No.: PCT/JP98/00476

§ 371 Date: Jul. 21, 1999

§ 102(e) Date: Jul. 21, 1999

(87) PCT Pub. No.: WO98/35382

PCT Pub. Date: Aug. 13, 1998

(30) Foreign Application Priority Data

Feb. 10, 1997 (JP) .................................................. 9-026487
Oct. 7, 1997 (JP) .................................................. 9-274117

(51) Int. Cl.[7] .......................... H01L 21/44; H01L 21/48; H01L 21/50
(52) U.S. Cl. ........................ 438/123; 438/124; 438/126; 438/127
(58) Field of Search .................................. 438/123, 124, 438/126, 127, FOR 371, FOR 374, FOR 377, FOR 380, FOR 384, 977, FOR 385, FOR 485

(56) References Cited

U.S. PATENT DOCUMENTS

| | | |
|---|---|---|
| 4,994,224 | 2/1991 | Itoch et al. . |
| 5,000,903 | 3/1991 | Matzinger et al. . |
| 5,218,759 | 6/1993 | Juskey et al. . |
| 5,441,684 * | 8/1995 | Iee . |
| 5,674,343 | 10/1997 | Hotta et al. . |
| 5,824,252 | 10/1998 | Miyajima . |
| 5,846,477 | 12/1998 | Hotta et al. . |

FOREIGN PATENT DOCUMENTS

| | | |
|---|---|---|
| 52-67966 | 6/1977 | (JP) . |
| 57-176751 | 10/1982 | (JP) . |
| 60-50354 | 11/1985 | (JP) . |
| 2-122555 | 5/1990 | (JP) . |
| 2-133943 | 5/1990 | (JP) . |
| 2-134832 | 5/1990 | (JP) . |
| 2-209739 | 8/1990 | (JP) . |
| 3-94459 | 4/1991 | (JP) . |
| 3-240260 | 10/1991 | (JP) . |
| 4-337657 | 11/1992 | (JP) . |
| 5-47954 | 2/1993 | (JP) . |

* cited by examiner

Primary Examiner—David E. Graybill
(74) Attorney, Agent, or Firm—Eric J. Robinson; Nixon Peabody LLP

(57) ABSTRACT

A method for manufacturing a semiconductor chip (15) which is bonded on a die pad (13) of a leadframe, and inner leads (12) are electrically connected to electrode pads of the semiconductor chip (15) with metal fine wires (16). The die pad (13), semiconductor chip (15) and inner leads are molded with a resin encapsulant (17). However, no resin encapsulant (17) exists on the respective back surfaces of the inner leads (12), which protrude downward from the back surface of the resin encapsulant (17) so as to be external electrodes (18).

8 Claims, 10 Drawing Sheets

RESIN MOLDED SEMICONDUCTOR DEVICE AND METHOD FOR MANUFACTURING THE SAME

TECHNICAL FIELD

The present invention relates to a resin-molded semiconductor device, in which a semiconductor chip and a leadframe are molded with a resin encapsulant, and to a method for manufacturing such a device. In particular, the present invention relates to a device with the back surface of the leadframe partially exposed out of the resin encapsulant.

BACKGROUND ART

In recent years, in order to catch up with rapidly advancing downsizing of electronic units, it has become increasingly necessary to package semiconductor components for each of these electronic units at a higher and higher density. Correspondingly, sizes and thicknesses of semiconductor components have also been noticeably reduced.

Hereinafter, a conventional resin-molded semiconductor device will be described.

FIG. 23(a) is a plan view of a conventional resin-molded semiconductor device, and FIG. 23(b) is a cross-sectional view of the conventional resin-molded semiconductor device.

As shown in FIGS. 23(a) and 23(b), this conventional resin-molded semiconductor device is of the type including external electrodes on its back surface.

The conventional resin-molded semiconductor device includes a leadframe consisting of: inner leads 201; a die pad 202; and support leads 203 for supporting the die pad 202. A semiconductor chip 204 is bonded onto the die pad 202 with an adhesive, and electrode pads (not shown) of the semiconductor to chip 204 are electrically connected to the inner leads 201 with metal fine wires 205. And the die pad 202, semiconductor chip 204, inner leads 201, support leads 203 and metal fine wires 205 are molded with a resin encapsulant 6. In this structure, no resin encapsulant 206 exists on respective back surfaces of the inner leads 201. In other words, the respective back surfaces of the inner leads 201 are exposed and respective lower parts of the inner leads 201, including these exposed back surfaces, serve as external electrodes 207.

In such a resin-molded semiconductor device, the respective back surfaces of the resin encapsulant 206 and those of the inner leads 201 are both located in the same plane, and the die pad 202 is located above the inner leads 201. That is to say, by providing depressed portions 208 for the support leads 203, the die pad 202 is elevated above the inner leads 201. Thus, after the device has been molded with the resin encapsulant 206, a thin layer of the resin encapsulant 206 is also formed on the back surface of the die pad 202. In FIG. 23(a), the resin encapsulant 206 is illustrated as being transparent such that the inside of the semiconductor device can be looked through. In FIG. 23(a), the semiconductor chip 204 is indicated by the dashed line and the illustration of the metal fine wires 205 is omitted.

Also, conventionally, to secure a required standoff height from the back surface of the resin encapsulant 206 in bonding the external electrodes to the electrodes of a motherboard such as a printed wiring board, on which a resin-molded semiconductor device is mounted, ball electrodes 209 of solder are attached to the external electrodes 207 as shown in FIG. 24. After the standoff height has been secured by these ball electrodes 209, the device is mounted onto the motherboard.

Hereinafter, a method for manufacturing the conventional resin-molded semiconductor device will be described with reference to the drawings. FIGS. 25 through 27 are cross-sectional views illustrating a manufacturing process for the conventional resin-molded semiconductor device.

First, as shown in FIG. 25, a leadframe 210, including the inner leads 201 and die pad 202, is prepared. It is noted that the die pad 202 is actually supported by the support leads, but the illustration of the support leads is omitted in FIG. 25. Depressed portions are formed in the support leads and the die pad 202 is elevated above the plane on which the inner leads 201 are located. The leadframe 210 does not include any tie bar used for preventing the resin encapsulant from flowing out during resin encapsulation.

Next, as shown in FIG. 26, the semiconductor chip 204 is bonded, with an adhesive, to the die pad 202 of the leadframe prepared. This process step is called "die bonding".

Then, as shown in FIG. 27, the semiconductor chip 204, which has been bonded onto the die pad 202, is electrically connected to the inner leads 201 via the metal fine wires 205. This process step is called "wire bonding". As the metal fine wires 205, aluminum (Al) or gold (Au) fine wires may be appropriately used, for example.

Subsequently, as shown in FIG. 28, the die pad 202, semiconductor chip 204, inner leads 201, support leads and metal fine wires 205 are molded with the resin encapsulant 206. In this case, the leadframe, on which the semiconductor chip 204 has been bonded, is introduced into a molding die assembly and transfer-molded. In particular, resin encapsulation is performed with the back surface of the inner leads 201 in contact with an upper or lower die of the die assembly.

Finally, the ends 211 of the inner leads 201, protruding outward from the resin encapsulant 206, are cut off after the resin encapsulation. By performing this cutting process step, the end faces of the inner leads 201 cut off are substantially flush with the side faces of the resin encapsulant 6 and the respective lower parts of the inner leads 201 are used as external electrodes 207.

In the manufacturing process of this conventional resin-molded semiconductor device, the resin encapsulant 206 might overflow from the edges of the inner leads 201, reach the back surfaces thereof and thereby form resin bur thereon (overflowing resin) during the resin encapsulation process step. Thus, a water jet process step is introduced for blowing off the resin bur after the resin encapsulation process step and before the process step of cutting off the inner leads 201.

Also, if necessary, ball electrodes of solder are formed on the lower surfaces of the external electrodes 207, thereby completing the resin-molded semiconductor device shown in FIG. 24. As another alternative, a solder plating layer is sometimes formed instead of the solder balls.

PROBLEMS TO BE SOLVED

The conventional resin-molded semiconductor device, however, has the following drawbacks. First, since the lower surfaces of the external electrodes 207 are located in substantially the same plane as that of the resin encapsulant 206 on the back of the semiconductor device, no standoff height from the resin encapsulant 206 can be obtained. Thus, the device must be mounted onto a motherboard with the ball electrodes 209 of solder interposed therebetween. Accordingly, mounting cannot be carried out efficiently.

In addition, during the resin encapsulation step of the conventional process for manufacturing a resin-molded semiconductor device, a leadframe, on which a semiconductor chip has been bonded, is introduced into a molding die assembly and then molded with a resin by pressing the inner leads against the surface of the lower die such that the leads closely contact the die. Even so, there occurs a problem that the resin encapsulant reaches the back surface of the inner leads to form a resin bur (overflowing resin) on the surface of the external electrodes.

FIG. 30 is a partial plan view illustrating, on a larger scale, the external electrodes 207 and their surroundings on the back of the semiconductor device as illustrated within the circle in FIG. 23(a). As shown in FIG. 30, resin bur 206a is sometimes formed on the respective lower surfaces of the external electrodes 207 during the conventional resin encapsulation process step. That is to say, the resin encapsulant 206 reaches the lower surfaces of the external electrodes 207 to form the resin bur 206a thereon during the resin encapsulation process step. In other words, part of each external electrode 207 is buried within the resin encapsulant 206.

Thus, a water jet process step has heretofore been introduced to blow off the resin bur 206a on the external electrodes 207. However, such a water jet process step is very troublesome and is contradictory to the demand on a process simplification to manufacture resin-molded semiconductor devices in high volume or on a reduction in number of process steps. That is to say, the formation of the resin bur is a non-negligible factor interfering with such simplification of manufacturing process.

A leadframe for a general-purpose resin-molded semiconductor device currently used is ordinarily made of copper (Cu) or Alloy 42. This material is plated with nickel (Ni) as an undercoat layer and then plated with palladium (Pd) and gold (Au). In the conventional process, however, if the resin bur is blown off with high-pressure water jet during the water jet process step introduced to remove the resin bur, then not only the resin bur, but also soft metal plating peel off with the water jet. Also, serious quality control problems, like deposition of impurities, might happen.

To avoid this problem, various measures can be taken, e.g., the leadframe may be plated after the water jet process step is over. However, in such a case, a metal layer preplating treatment (or a preparatory plating treatment) cannot be performed, i.e., the leadframe cannot be plated prior to the resin encapsulation process step. Accordingly, the plating process step cannot be performed efficiently, thus further interfering with the simplification of manufacturing process. Also, such a measure is not preferable in terms of the reliability of a resin-molded semiconductor device, either.

An object of this invention is providing a resin-molded semiconductor device and a method for manufacturing the same, which can meet the demand on a simplified manufacturing process by suppressing the formation of resin bur on the back of a leadframe or by ensuring a standoff height of external electrodes from a resin encapsulant during a resin encapsulation process step.

DISCLOSURE OF INVENTION

In order to achieve this object, the present invention discloses a resin-molded semiconductor device formed by using a seal tape for preventing the overflow of a resin during resin encapsulation and a method for manufacturing a resin-molded semiconductor device using a seal tape.

A resin-molded semiconductor device according to the present invention includes: a semiconductor chip having electrode pads; inner leads; connection members for electrically connecting the electrode pads of the semiconductor chip to the inner leads; and a resin encapsulant for molding the semiconductor chip, inner leads and connection members together. The lower part of each said inner lead, including at least part of the back surface thereof, functions as an external electrode. And the external electrode protrudes downward from the back surface of the resin encapsulant.

In this structure, since the external electrode of the inner lead protrudes from the resin encapsulant, a standoff height can be secured for the external electrode. That is to say, in this structure, the inner leads can be directly connected, as external terminals, onto a motherboard without providing any ball electrodes for the external electrodes. As a result, the first object is accomplished.

The resin-molded semiconductor device may further include: a die pad for supporting the semiconductor chip thereon; and support leads for supporting the die pad. Each said support lead may include a depressed portion for elevating the die pad above the inner leads.

In such an embodiment, the resin encapsulant exists under the die pad, thus increasing the force of the resin encapsulant holding the die pad and semiconductor chip. In addition, since the die pad is slightly elevated only by the depth of the depression of the support leads, the structure of the resin-molded semiconductor device can be kept thin without increasing the thickness of the resin-molded semiconductor device so much.

In the resin-molded semiconductor device, a protrusion height of the external electrodes as measured from the back surface of the resin encapsulant is preferably in the range from about 10 µm to about 40 µm.

In such an embodiment, the force of the resin encapsulant holding the inner leads is not weakened so much and the external electrodes can be made to function as external terminals.

A basic method for manufacturing a resin-molded semiconductor device according to the present invention includes: a first step of preparing molding die assembly, semiconductor chip and peripheral member; a second step of attaching a seal tape to between the peripheral member and the die assembly such that the seal tape adheres to part of a surface of the peripheral member; a third step of encapsulating the semiconductor chip and the peripheral member, except for at least the part of the surface thereof, within a resin encapsulant with the seal tape attached; and a fourth step of removing the seal tape after the third step has been performed. After the fourth step has been performed, at least the part of the surface of the peripheral member is exposed out of the resin encapsulant.

According to this method, if there is any part to be exposed without fail in the peripheral member, a structure with that part exposed out of the resin encapsulant can be obtained by adhering the seal tape to that part of the peripheral member in the second step. Also, since no resin bur is formed on that part of the peripheral member, either, conventionally required process steps, like water jet, can be eliminated. As a result, the manufacturing process can be simplified, and therefore, the first object is accomplished.

In the basic method for manufacturing a resin-molded semiconductor device, the first step may include: a first sub-step of preparing, as the peripheral member, a leadframe including inner leads and a region for supporting the semiconductor chip thereon; a second sub-step of bonding the semiconductor chip onto the region of the leadframe for supporting the semiconductor chip thereon; and a third sub-step of electrically bonding the semiconductor chip to the inner leads. In the second step, the seal tape may be adhered to the back surfaces of the inner leads.

According to this method, a resin-molded semiconductor device, in which a semiconductor chip, connected to a lead-frame, is provided within a resin encapsulant, is obtained. Also, the back surfaces of the inner leads never fail to be exposed out of the resin encapsulant. Furthermore, by regulating the pressure of the inner leads against the seal tape, the protrusion height of the inner leads as measured from the back surface of the resin encapsulant, i.e., the standoff height of the inner leads, can be adjusted. Accordingly, a resin-molded semiconductor device, attaining the effects of the first resin-molded semiconductor device described above, can be formed easily.

In the method for manufacturing a resin-molded semiconductor device including the leadframe, in the first sub-step of the first step, a die pad may be formed as the region for supporting the semiconductor chip thereon. Support leads may be formed for supporting the die pad. And a depressed portion for elevating the die pad above the inner leads may be formed in each said support lead. In the second sub-step of the first step, the semiconductor chip may be bonded onto the die pad. In the third sub-step of the first step, the semiconductor chip, which has been bonded onto the die pad, may be electrically bonded to the inner leads via metal fine wires. And in the second step, the seal tape may be adhered only to the back surfaces of the inner leads in the leadframe.

According to this method, the resin encapsulant can exist under the back of the die pad without increasing the total thickness of the resin-molded semiconductor device so much. As a result, the force of the resin encapsulant holding the die pad can be increased and a thinner resin-molded semiconductor device can be formed easily.

The method for manufacturing a resin-molded semiconductor device including the leadframe may further include the step of cutting off part of each said inner lead laterally protruding out of the resin encapsulant such that end faces of the inner leads are substantially flush with the side faces of the resin encapsulant after the fourth step has been performed.

According to this method, a laterally protruding portion can be eliminated from each inner lead. As a result, a resin-molded semiconductor device with a reduced area can also be formed.

In the method for manufacturing a resin-molded semiconductor device including the leadframe, in the first sub-step of the first step, the leadframe prepared may have been plated with nickel (Ni), palladium (Pd) and gold (Au) layers.

According to this method, plated layers of quality can be formed by pre-plating, and the use of a seal tape can eliminate additional process steps for removing resin bur, such as a water jet process step, which are usually performed after resin encapsulation. Accordingly, even when resin bur should be removed, the plated layers do not peel off.

In the method for manufacturing a resin-molded semiconductor device including the leadframe, in the second step, the seal tape attached may have such a thickness as corresponding to a predetermined value, which is equal to the height of the lower surfaces of the inner leads protruding downward from the back surface of the resin encapsulant after the resin encapsulation.

According to this method, the protrusion height of the inner leads can be easily adjusted based on the thickness of the seal tape. Accordingly, not only the force of the resin encapsulant holding the inner leads, but also the standoff height provided for making the lower part of each inner lead function as an external terminal can be controlled at respectively adequate values.

In the basic method for manufacturing a resin-molded semiconductor device, the first step may include: a first sub-step of preparing a substrate as the peripheral member, the upper surface of the substrate being provided with interconnects, the back surface of the substrate being provided with external electrodes to be connected to the interconnects; a second sub-step of bonding the semiconductor chip onto the upper surface of the substrate; and a third sub-step of electrically connecting the semiconductor chip to the interconnects on the upper surface of the substrate via connection members. In the second step, the seal tape may be adhered at least to the external electrodes.

According to this method, a resin-molded semiconductor device of a substrate-bonded type, in which external electrodes are exposed out of the resin encapsulant without fail, can be formed.

In the basic method for manufacturing a resin-molded semiconductor device, the first step may include: a first sub-step of preparing at least a radiator plate as the peripheral member; and a second sub-step of mounting the semiconductor chip on the radiator plate. In the second step, the seal tape may be attached to the back surface of the radiator plate.

According to this method, a resin-molded semiconductor device including a radiator plate with good radiation properties, in which no resin encapsulant overflows to reach the back of the radiator plate, can be formed.

In the method for manufacturing a resin-molded semiconductor device including the radiator plate, in the first substep of the first step, a leadframe including leads and a bed may be further prepared as the peripheral member. In the second sub-step of the first step, the semiconductor chip may be bonded onto the bed and then the bed may be mounted onto the radiator plate, thereby mounting the semiconductor chip over the radiator plate.

According to this method, a resin-molded semiconductor device including a radiator plate can be formed easily by using a leadframe.

In the basic method for manufacturing a resin-molded semiconductor device, in the first step, a lead assembly, including inner and outer leads, may be prepared as the peripheral member. In the second step, the seal tape may be adhered to between the inner leads and the molding die assembly so as to be attached to part of the surface of each said inner lead. In the third step, all the members, except for at least the part of the surface of each said inner lead, may be encapsulated within the resin encapsulant with the seal tape attached, thereby forming a resin package including an opening and a recess within the opening. The method may further include, posterior to the fourth step, the steps of: mounting the semiconductor chip having the electrode pads into the recess of the resin package; electrically connecting the electrode pads of the semiconductor chip to the inner leads via connection members; and sealing the opening with a sealing member. After the fourth step has been performed, at least the part of the surface of each said inner lead may be exposed out of the resin encapsulant.

According to this method, it is possible to form easily a resin-molded semiconductor device, which a solid-state imaging device or the like, requiring an overlying free space, is built in. In such a case, a connection portion between an inner lead and the semiconductor chip can be exposed out of the resin encapsulant without fail.

BEST MODE FOR CARRYING OUT THE INVENTION

EMBODIMENT 1

Figure 1A:
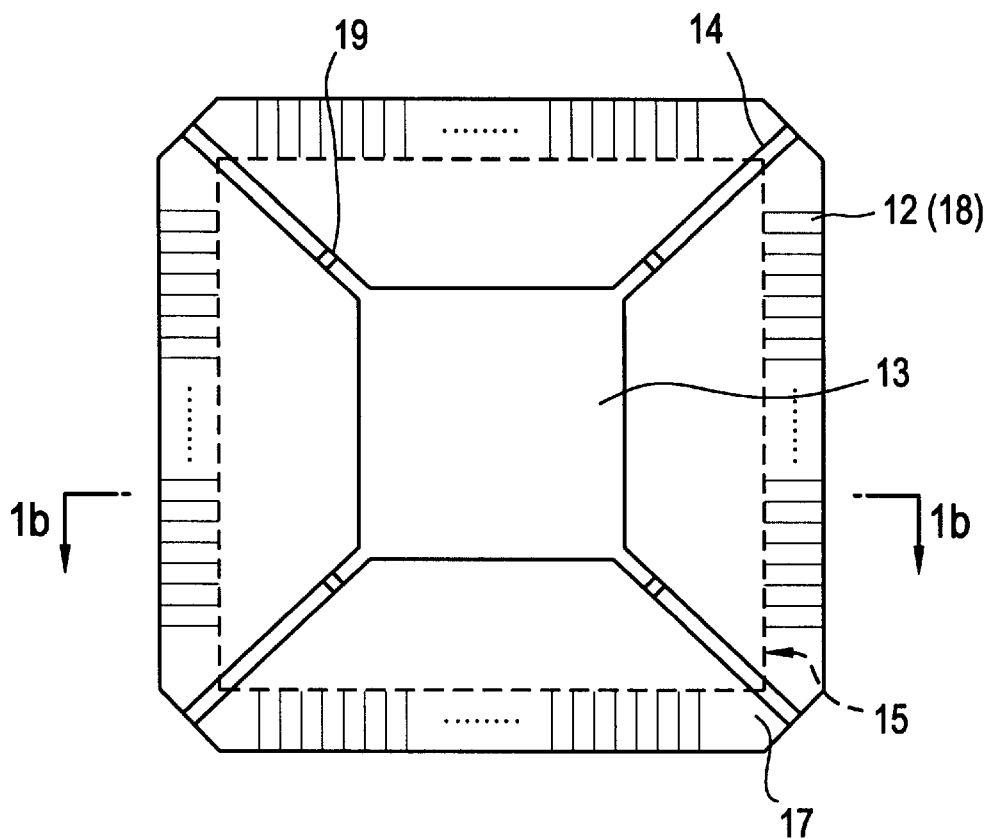
FIGS. 1(a) and 1(b) are respectively plan view and cross-sectional view of a resin-molded semiconductor device according to a first embodiment of the present invention, in which a resin encapsulant is illustrated as being transparent.
Figure 1B:
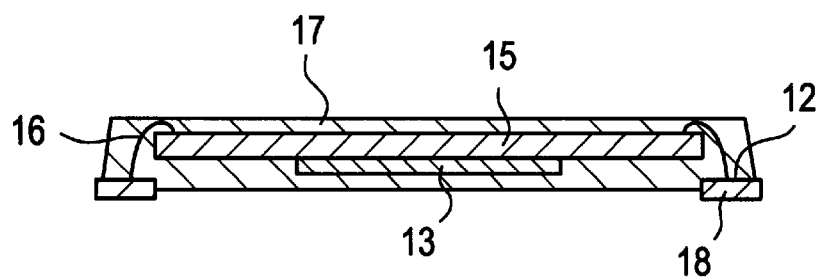

FIG. 1(a) is a plan view of a resin-molded semiconductor device according to a first embodiment, and FIG. 1(b) is a cross-sectional view thereof taken along the line 1b—1b in FIG. 1(a). In FIG. 1(a), a resin encapsulant 17 is illustrated as being transparent, a semiconductor chip 15 has a contour as indicated by the dashed line, and the illustration of metal fine wires 16 is omitted.

As shown in FIGS. 1(a) and 1(b), the resin-molded semiconductor device of this embodiment includes a leadframe consisting of: inner leads 12; a die pad 13 for supporting the semiconductor chip thereon; and support leads 14 for supporting the die pad 13. The semiconductor chip 15 is bonded on the die pad 13 with an adhesive, and electrode pads (not shown) of the semiconductor chip 15 are electrically connected to the inner leads 12 with metal fine wires 16. And the inner leads 12, die pad 13, support leads 14, semiconductor chip 15 and metal fine wires 16 are encapsulated within the resin encapsulant 17. Also, the die pad 13 is elevated by depressed portions 19 of the support leads 14 so as to be located above the inner leads 12. Accordingly, after the chip, frame and so on have been molded with the resin encapsulant 17, a thin layer of the resin encapsulant 17 exists under the back surface of the die pad 13.

Hereinafter, the features of the resin-molded semiconductor device according to this embodiment will be described. No resin encapsulant 17 exists on the respective lower parts of the inner leads 12. In other words, the respective lower surfaces of the inner leads 12 are exposed, and are used as interconnection with a motherboard. That is to say, the respective lower parts of the inner leads 12 function as external electrodes 18. In addition, virtually no resin burr, which ordinarily sticks out during a resin encapsulation process step, exists on the external electrodes 18. And the external electrodes 18 slightly protrude downward from the back surface of the resin encapsulant 17. The external electrodes 18 can be easily formed in such a shape by the manufacturing process described later so as to protrude downward and have no resin burr thereon.

In the resin-molded semiconductor device of this embodiment, no outer leads, which function as external electrode terminals in many conventional structures, exist beside the inner leads 12. Instead, the lower part of each inner lead 12, including the lower and side faces thereof, functions as an external electrode 18. Accordingly, such a structure contributes to downsizing of a semiconductor device. Moreover, since no resin burr exists on the respective lower surfaces of the inner leads 12, i.e., the lower surfaces of the external electrodes 18, the electrodes of the motherboard can be bonded to these external electrodes 18 with more reliability. Furthermore, the external electrodes 18 are formed to protrude from the plane of the resin encapsulant 17. Thus, a standoff height, which should be secured in bonding the external electrodes to the electrodes of the motherboard during mounting of the resin-molded semiconductor device onto the motherboard, has already been provided for the external electrodes 18. Accordingly, the external electrodes 18 can be used as external terminals as they are. Also, unlike the conventional process, there is no need to attach solder balls to the external electrodes 18 during mounting of the device onto the motherboard. Therefore, this method is advantageous in the number and cost of manufacturing process steps.

In addition, the die pad 13 is elevated above the inner leads 12 and a thin layer of the resin encapsulant 17 exists on the back of the die pad 13. As a result, the reliability of the resin-molded semiconductor device improves.

In this embodiment, the die pad 13 is provided for supporting the semiconductor chip 15 thereon. Alternatively, even if it were not for the die pad 13, the semiconductor chip still could be supported by the respective insulated ends of the inner leads or mounted on a plastic tape. That is to say, the die pad 13 is not always required, and this embodiment is applicable to a leadframe without a die pad.

Also, in this embodiment, the metal fine wires 16 are used as means for electrically connecting the electrodes of the semiconductor chip 15 to the inner leads 12. Alternatively, the electrodes of the semiconductor chip 15 may be electrically connected to the inner leads 12 by flip-chip bonding (i.e., with bumps interposed therebetween) or direct bonding (i.e., by forming a eutectic alloy).

Next, a method for manufacturing the resin-molded semiconductor device of this embodiment will be described with reference to the drawings. FIGS. 2 through 7 are cross-sectional views illustrating a manufacturing process of the resin-molded semiconductor device of this embodiment.

Figure 2:
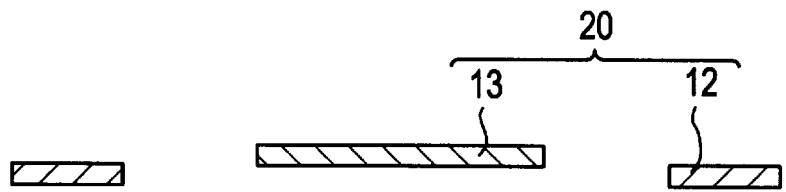
FIG. 2 is a cross-sectional view illustrating the process step of preparing a leadframe during a manufacturing process of the resin-molded semiconductor device in the first embodiment.

First, in the process step shown in FIG. 2, a lead-frame 20, including inner leads 12 and a die pad 13 for supporting a semiconductor chip thereon, is prepared. Although the die pad 13 is actually supported by support leads, the support leads are not illustrated in FIG. 2 because the leads are not included in this cross section. Also, a depressed portion is formed in each of these support leads, thereby the die pad 13 is elevated above the plane on which the inner leads 12 are located. The leadframe 20 prepared is not provided with tie bars used for stopping the outflow of a resin encapsulant during resin encapsulation.

The leadframe 20 of this embodiment is formed by plating a frame made of copper (Cu) with the three metal layers of: an undercoat nickel (Ni) layer; a palladium (Pd) layer plated thereon; and an outermost thin gold (Au) layer. Alternatively, the leadframe 20 may be made of any raw material other than copper (Cu), e.g., Alloy 42. Also, the leadframe 20 may be plated with any noble metals other than nickel (Ni), palladium (Pd) and gold (Au). Furthermore, the number of plated layers does not have to be three.

Figure 3:
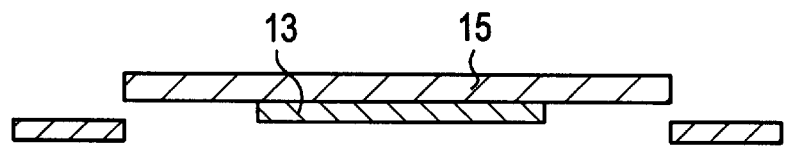
FIG. 3 is a cross-sectional view illustrating the process step of bonding a semiconductor chip onto a die pad during the manufacturing process of the resin-molded semiconductor device in the first embodiment.

Next, in the process step shown in FIG. 3, a semiconductor chip 15 is mounted and bonded, with an adhesive, onto the die pad of the leadframe prepared. This process step is so-called "die bonding". It should be noted that any support member other than a leadframe may be used to support the semiconductor chip. For example, a TAB tape or a substrate may also be used.

Figure 4:
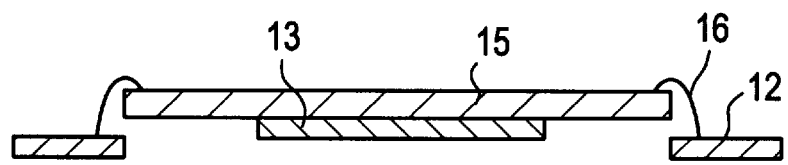
FIG. 4 is a cross-sectional view illustrating the process step of forming metal fine wires during the manufacturing process of the resin-molded semiconductor device in the first embodiment.

Then, in the process step shown in FIG. 4, the semiconductor chip 15, which has been bonded onto the die pad 13, is electrically bonded to the inner leads 12 with metal fine wires 16. This process step is so-called "wire bonding". The metal fine wires may be made of an appropriately selected material such as aluminum (Al) or gold (Au). Optionally, the semiconductor chip 15 may be electrically connected to the inner leads 12 via bumps or the like, not the metal fine wires 16.

Figure 5:
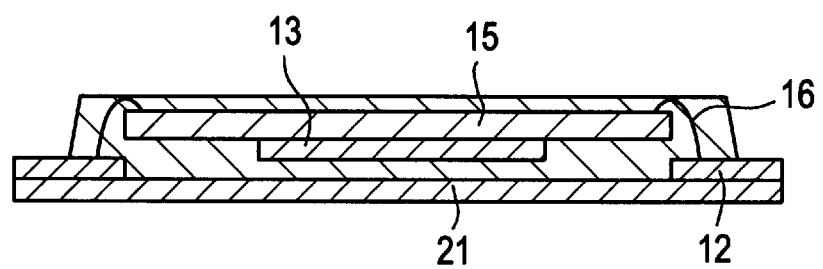
FIG. 5 is a cross-sectional view illustrating the process step of placing a seal tape under the leadframe during the manufacturing process of the resin-molded semiconductor device in the first embodiment.

Subsequently, in the process step shown in FIG. 5, a seal tape 21 is attached to the respective back surfaces of the inner leads 12 with the semiconductor chip 15 bonded onto the die pad 13 of the leadframe.

The seal tape 21 is used as a sort of mask for preventing the resin encapsulant from overflowing and reaching the respective lower surfaces of the inner leads 12 during resin encapsulation. The existence of the seal tape 21 can prevent resin burr from being formed on the back surfaces of the inner leads 12. The seal tape 21 attached to the inner leads 12 and so on may be any resin-based tape, which is mainly composed of polyethylene terephthalate, polyimide, polycarbonate or the like, can be easily peeled after the resin encapsulation and has some resistance to an elevated-temperature environment during the resin encapsulation. In this embodiment, a tape mainly composed of polyethylene terephthalate is used and the thickness thereof is 50 μm.

In this embodiment, the seal tape 21 is attached to the entire back surface of the leadframe, but is adhered only to the surfaces of the inner leads 12 of the leadframe. That is to say, the seal tape 21 does not adhere to the back surface of the die pad 13, which is elevated by the depressed portions of the support leads. Alternatively, the radiation properties of the die pad 13 may be increased by adhering the seal tape 21 to the back surface of the die pad 13 and then peeling the seal tape 21 off to expose the back surface of the die pad 13 after the resin encapsulation step.

Figure 6:
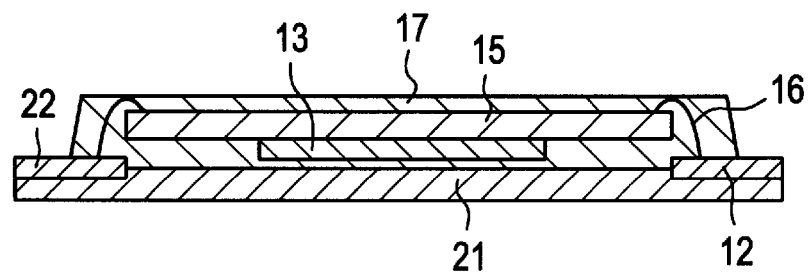
FIG. 6 is a cross-sectional view illustrating a resin encapsulation process step during the manufacturing process of the resin-molded semiconductor device in the first embodiment.

Then, in the process step shown in FIG. 6, the lead-frame, on which the semiconductor chip 15 has been bonded and to which the seal tape 21 has been attached, is introduced into a die assembly. And a resin encapsulant 17 is poured into the die assembly to mold the chip, frame and so on with the encapsulant 17. In this case, resin encapsulation is performed while pressing downward the ends 22 of the inner leads 12 of the leadframe with the dies such that the resin encapsulant 17 does not reach the respective lower surfaces of the inner leads 12. The resin encapsulation is also performed with the seal tape 21 on the back of the inner leads 12 pressed against the face of the die.

Figure 7:
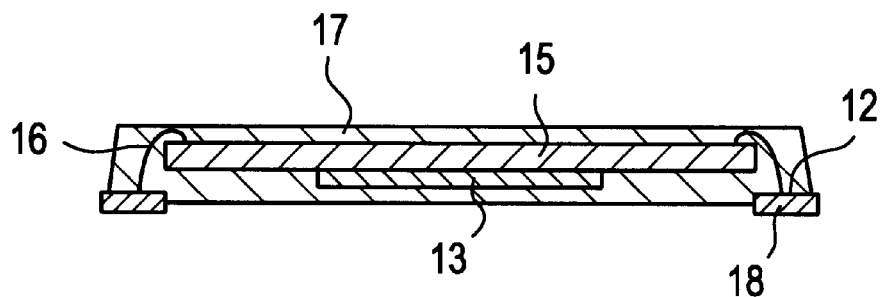
FIG. 7 is a cross-sectional view of the resin-molded semiconductor device after the process step of cutting off the ends of the inner leads is finished during the manufacturing process of the resin-molded semiconductor device in the first embodiment.

Finally, in the process step shown in FIG. 7, the seal tape 21, which has been attached to the respective back surfaces of the inner leads 12, is peeled off and removed, thereby forming external electrodes 18, protruding from the back surface of the resin encapsulant 17. Then, the ends of the inner leads 12 are cut off to be substantially flush with the side faces of the resin encapsulant 17, thereby completing a resin-molded semiconductor device such as that shown in FIG. 7.

Figure 8:
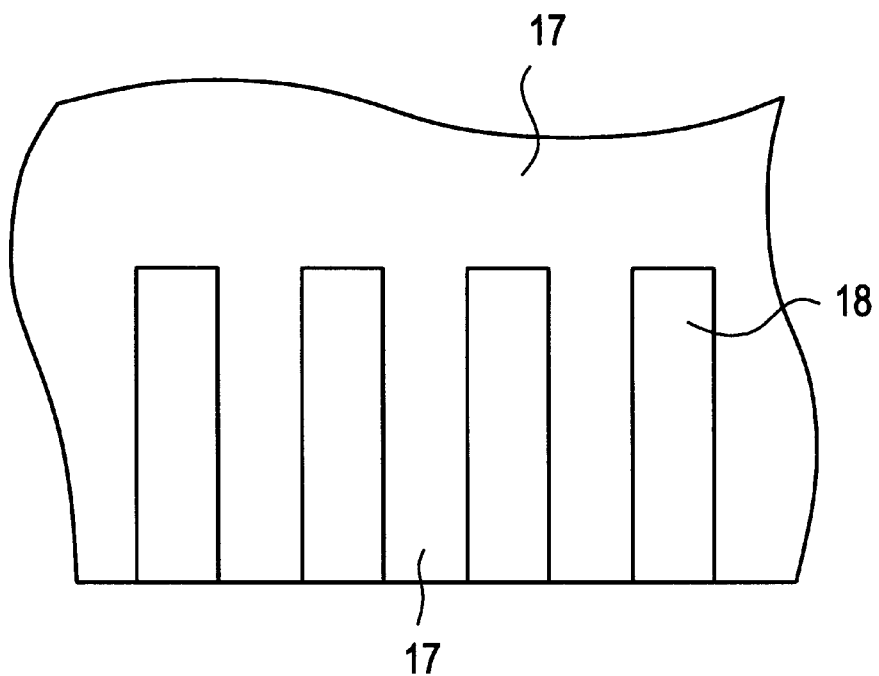
FIG. 8 is a partial bottom view of the resin-molded semiconductor device formed by the manufacturing process of the resin-molded semiconductor device in the first embodiment.

FIG. 8 is a partial bottom view of the resin-molded semiconductor device of this embodiment, illustrating respective parts of the external electrodes 18 on a larger scale. As shown in FIG. 8, in this embodiment, the formation of resin bur on the back and side faces of the inner leads 12, i.e., on the surfaces of the external electrodes 18, can be prevented. This is because the resin encapsulation process step is performed with the seal tape 21 adhered to the back surface of the leadframe. Also, unlike a conventional manufacturing process, it is possible to prevent the resin encapsulant 17 from reaching the surfaces of the external electrodes 18 and part of the external electrodes 18 from being buried in the resin encapsulant 17.

According to the manufacturing method of this embodiment, the seal tape 21 is attached in advance to the respective back surfaces of the inner leads 12 before the resin encapsulation process step. Thus, the resin encapsulant 17 cannot reach, and no resin burr is formed on, the back surfaces of the inner leads 12 functioning as external electrodes. Accordingly, resin burr, formed on the inner leads, need not be removed therefrom using water jet or the like, unlike a conventional method for manufacturing a resin-molded semiconductor device with the lower surfaces of inner leads entirely exposed. That is to say, since this troublesome step of deburring can be omitted, this process is simple enough to mass-produce a great number of resin-molded semiconductor devices. In addition, peeling of metal plated layers such as nickel (Ni), palladium (Pd) and gold (Au) on the leadframe, which might happen during the conventional deburring process step using water jet, for example, can be eliminated. For that reason, the leadframe can be plated in advance with these metal layers before the resin encapsulation process step.

In addition, since the external electrodes 18 formed by the manufacturing process of this embodiment protrude from the resin encapsulant 17, the external electrodes 18 can be used as external terminals as they are, without providing solder balls as in a conventional process.

Although the step of deburring using water jet can be omitted, the step of attaching the seal tape should be additionally performed in this embodiment. However, the step of attaching the seal tape 21 is more cost-effective than the water jet process step. And it is easier to control the former process step than the latter. Accordingly, the process can be simplified without fail. Among other things, the method of this embodiment is particularly advantageous in that attaching the seal tape can eliminate the water jet process step conventionally required, which has brought about various quality-control problems like peeling of metal plated layers from the leadframe and deposition of impurities thereon. Thus, in this embodiment, the plated metal layers are much less likely to peel off. Also, it is true that resin burr still may be formed in this embodiment depending on the attachment state of the seal tape. Even so, the resulting resin burr is very thin, and can be easily removed with water jet at a low water pressure. Accordingly, should such a water jet process step be required, peeling of the metal plated layers still can be prevented. And there is no problem if the leadframe is plated with these metal layers beforehand.

It should be noted that a level difference is formed between the respective back surfaces of the inner leads 12 and that of the resin encapsulant 17 as shown in FIG. 6. This is because the seal tape 21 softens and thermally shrinks owing to the heat applied by the molten resin encapsulant during the resin encapsulation step, and the inner leads 12 are strongly forced into the seal tape 21. Accordingly, in this structure, the back surfaces of the inner leads 12 protrude from that of the resin encapsulant 17. As a result, a stand-off height of the external electrodes 18, or the respective lower parts of the inner leads 12, can be secured. Therefore, these protruding external electrodes 18 can be used as external terminals as they are.

The height of the level difference between the respective back surfaces of the inner leads 12 and that of the resin encapsulant 17 can be controlled based on the thickness of the seal tape 21 attached before the step of encapsulating. For example, in this embodiment, since the thickness of the seal tape 21 is 50 μm, the height of the level difference, i.e., the protrusion height of the external electrodes 18, is usually about one-half of the thickness, and 50 μm at its maximum. That is to say, the height of a portion of the seal tape 21 upwardly forced as measured from the back surfaces of the inner leads 12 is determined depending on the thickness of the seal tape 21. In other words, the protrusion height of the external electrodes 18 can be self-controlled by the thickness of the seal tape 21, thus facilitating the manufacturing. The protrusion height of the external electrodes 18 can be controlled only by adjusting the thickness of the seal tape 21 during a mass production process, and there is no need to provide an additional process step separately. Accordingly, the manufacturing method of this embodiment is extremely advantageous in terms of the process control cost. It should be noted that as for the seal tape 21 to be attached, the hardness of a material used, the thickness and the thermal softening properties thereof can be determined depending on the desired height of the level difference.

In the resin-molded semiconductor device of this embodiment, although the resin encapsulant 17 exists on the back of the die pad 13 as shown in FIG. 2, the thickness thereof is equal to the elevated height of the die pad 13, and is extremely small. Thus, the resin-molded semiconductor device of this embodiment is substantially one-side-encapsulated semiconductor device.

In the foregoing exemplary embodiment, the seal tape 21 is attached in advance to the respective lower surfaces of the inner leads 12 of the leadframe before the resin encapsulation process step. Instead of attaching the tape to the leadframe this way, the seal tape 21 may be placed on a molding die assembly and the leadframe may be adhered thereto. In such a case, the seal tape can be reeled off and supplied to the molding die assembly as will be described later. As a result, the process can be further simplified.

Also, in this embodiment, a manufacturing process, in which resin encapsulation is performed with the seal tape attached to the back of the leadframe, has been exemplified. However, the method of the present invention is not limited to a semiconductor device including a leadframe. A technique of using a seal tape during a resin encapsulation process step, which is a basic concept of the present invention, is broadly applicable to any resin encapsulation process step for a semiconductor device incorporating a semiconductor chip and including some members to be molded with resin. Thus, this technique is applicable to a resin encapsulation process step for a semiconductor device of a TAB or substrate type.

EMBODIMENT 2

Figure 9:
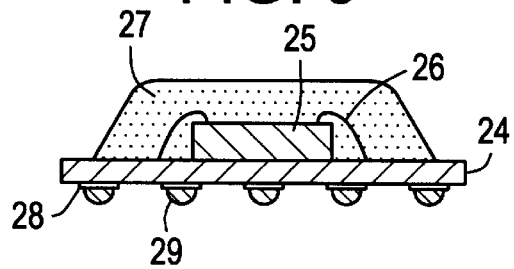
FIG. 9 is a cross-sectional view of a resin-molded semiconductor device of a substrate-bonded type according to a second embodiment of the present invention.

Next, a second embodiment of the present invention will be described. FIG. 9 is a cross-sectional view illustrating a resin-molded semiconductor device of a substrate-bonded type according to this embodiment.

As shown in FIG. 9, the resin-molded semiconductor device of this embodiment is of a substrate-bonded type such as a BGA (ball grid array) type. The device includes: a substrate 24 made of single- or multiple-layered glass epoxy plastic or ceramic; a semiconductor chip 25 mounted on the substrate 24; and metal fine wires 26 for electrically connecting interconnects (not shown) formed on the upper surface of the substrate 24 to electrode pads (not shown) of the semiconductor chip 25. And over the upper surface of the substrate 24, the semiconductor chip 25, interconnects and metal fine wires 26 are molded with an insulating resin encapsulant 27. On the back of the substrate 24, external electrode pads (lands) 28 are formed. The interconnects on the upper surface of the substrate 24 are connected to the external electrode pads (lands) 28 on the back surface of the substrate 24 by way of through holes or via holes.

In this embodiment, ball electrodes 29, which are made of a conductive material for bonding the substrate 24 to an external board, are provided for the external electrode pads 28. However, the ball electrodes 29 do not have to be provided. Also, the substrate 24 may be a thin polyimide film, for example.

According to this embodiment, the assembly is transfer-molded with a resin encapsulant while a seal tape is attached to the back of the substrate 24 during a resin encapsulation process step as will be described later. Thus, it is possible to prevent the resin encapsulant 27 from overflowing to reach the external electrode pads 28. Consequently, a surface to be connected to a motherboard can be free from resin bur, which would otherwise be formed on the external electrode pads 28, and the reliability in connecting with the ball electrodes 29 interposed can be improved.

Figure 11:
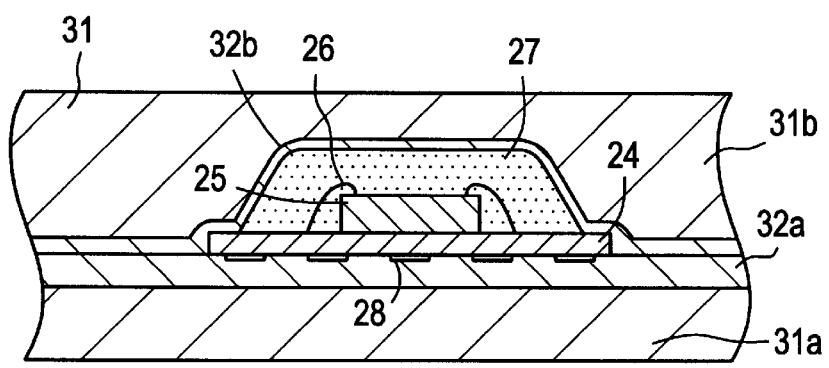
FIG. 11 is a cross-sectional view illustrating a resin encapsulation process step during the manufacturing process of the resin-molded semiconductor device in the second embodiment.
Figure 12:
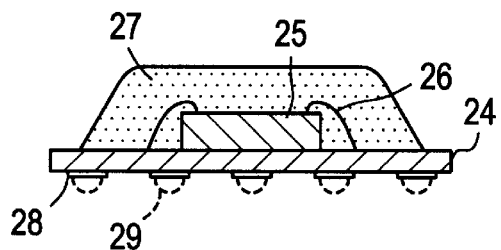
FIG. 12 is a cross-sectional view of a resin-molded assembly after the seal tape has been removed during the manufacturing process of the resin-molded semiconductor device in the second embodiment.

Next, a method for manufacturing the resin-molded semiconductor device of this embodiment will be described with reference to the drawings. FIGS. 10 through 12 are cross-sectional views illustrating, on a step-by-step basis, a manufacturing process for the BGA-type resin-molded semiconductor device of this embodiment.

Figure 10A:
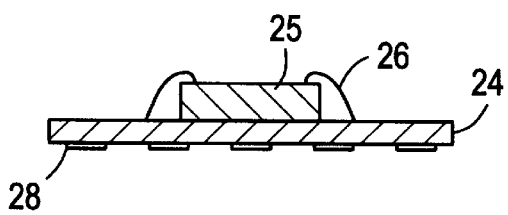
FIGS. 10(a) and 10(b) are cross-sectional views illustrating the process step of bonding a semiconductor chip onto the substrate with metal fine wires and the process step of mounting a semiconductor chip onto the substrate with bumps, respectively, during a manufacturing process of the resin-molded semiconductor device in the second embodiment.

First, in the process step shown in FIG. 10(a), interconnects (not shown) are formed on the substrate 24, which is a single- or multiple-layered glass epoxy plastic or ceramic plate. Through holes or via holes are formed in the substrate 24. And the external electrode pads 28 are formed on the back of the substrate 24. Thereafter, the semiconductor chip 25 is bonded at a predetermined position on the substrate 24 with a die-bonding member, for example, and the interconnects on the substrate are connected to electrode pads (not shown) on the semiconductor chip with the metal fine wires 26.

Figure 10B:
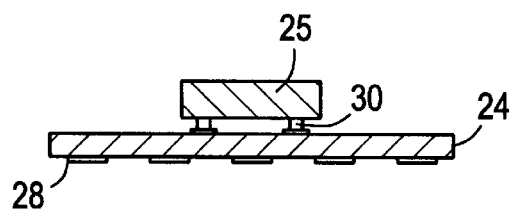

Alternatively, the semiconductor chip 25 may be mounted onto the substrate 24 in a facedown manner shown in FIG. 10(b). In such a case, the interconnects on the substrate 24 are ordinarily bonded to the electrode pads on the semiconductor chip 25 with metal balls 30 like bumps. As the case may be, the interconnects on the substrate 24 and the electrode pads on the semiconductor chip 25 are alloyed and directly bonded to each other. The subsequent process steps will be described on the supposition that the bonding structure shown in FIG. 10(a) has been adopted here.

Next, in the process step shown in FIG. 11, resin encapsulation is performed using a molding die assembly 31, consisting of lower and upper dies 31a and 31b, to mold the semiconductor chip 25, interconnects, and metal fine wires 26 over the substrate 24. In this step, before the resin encapsulation is performed, a first seal tape 32a is attached to the back of the substrate 24, i.e., to the upper surface of the lower die 31a of the molding die assembly 31, thereby adhering the seal tape 32a to the lower surfaces of the external electrode pads 28 of the substrate 24. In this case, the pressure applied to the die assembly forces the external electrode pads 28 into the seal tape 32a. As a result, the seal tape 32a adheres to the back of the substrate 24 and to lower surfaces of the external electrodes 28. In addition, a second seal tape 32b is also adhered to the lower surface of the upper die 31b of the molding die assembly 31. By transfer-molding the assembly with the resin encapsulant 27 in such a state, only the regions surrounding the semiconductor chip 25 can be molded with the resin over the upper surface of the substrate 24 and the overflow of the resin encapsulant to the back of the substrate 24 can be prevented. And as described above, it is possible to prevent the resin bur from being formed on the external electrode pads 28 on the back of the substrate 24.

Also, since not only the first seal tape 31a but also the second seal tape 32b are used, the resin encapsulant 27 can be advantageously released from the upper die 31b easily.

According to such a resin encapsulation technique, resin encapsulation is performed with pressure applied to the substrate 24 through the molding die assembly 31. Since pressure is herein applied to the structure with the substrate 24 interposed between the first and second seal tapes 32a and 32b, the force applied to the substrate 24 can be cushioned and the fracture or deformation of the substrate 24 can be advantageously prevented during the resin encapsulation.

Finally, in the process step shown in FIG. 12, the resin-molded assembly, in which the regions surrounding the semiconductor chip 25 over the substrate 24 are molded with the resin encapsulant 27, is released from the molding die assembly 31. As a result, a resin-molded package, in which no resin encapsulant has reached the external electrode pads 28 on the back of the substrate 24, is obtained.

If the ball electrodes 29 (indicated by the phantom lines) are provided for the external electrode pads 28 on the back of the substrate 24, a resin-molded semiconductor device of a BGA type can be obtained. Alternatively, if these external electrode pads 28 have been formed with a relatively large thickness, then the external electrode pads 28 may be used as external terminals as they are without forming the ball electrodes 29 thereon.

As can be understood, in the method for manufacturing a BGA-type resin-molded semiconductor device according to this embodiment, the first and second seal tapes 32a and 32b are used. By utilizing the elasticity thereof, deformation of the substrate 24 within the molding die assembly can be suppressed, and deposition of the resin encapsulant or foreign particles on the external electrode pads 28 of the substrate 24 can be prevented.

Of the first and second seal tapes 32a and 32b, the first seal tape 32a is not always required. Even if only the second seal tape 32b is provided, it is also possible to prevent the overflow of the resin encapsulant to the sides or back of the substrate 24, since the second seal tape 32b is in contact with the upper surface of the substrate 24.

Furthermore, the seal tape 32a does not have to be adhered to the entire back face of the substrate 24. The seal tape 32a is only required to adhere to at least the lower surfaces of the external electrode pads 28.

EMBODIMENT 3

Figure 13:
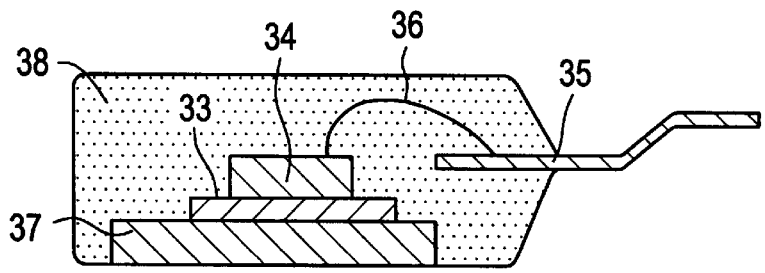
FIG. 13 is a cross-sectional view of a resin-molded semiconductor device including a radiator plate according to a third embodiment of the present invention.

Next, a third embodiment of the present invention will be described. FIG. 13 is a cross-sectional view illustrating a resin-molded semiconductor device according to this embodiment. The resin-molded semiconductor device of this embodiment includes: a radiator plate; and a semiconductor chip incorporating a device generating a relatively large quantity of heat, e.g., a high-power transistor.

As shown in FIG. 13, the semiconductor device of this embodiment includes: a bed 33, or a support for a leadframe; a semiconductor chip 34 bonded on the bed 33 with a die-bonding member; a metal terminal 35 of the leadframe; a metal fine wire 36 for electrically connecting the metal terminal 35 to the semiconductor chip 34; and a radiator plate 37 for supporting the bed 33 thereon. In this structure, all the members are entirely molded with an insulating resin encapsulant 38, except for the bottom of the radiator plate 37 and part of the metal terminal 35 protruding out of the resin encapsulant 38 as an external terminal. That is to say, the upper and side faces of the radiator plate 37, bed 33, semiconductor chip 34, metal fine wire 36 and the other part of the metal terminal 35 are molded with the resin encapsulant 38.

According to this embodiment, the assembly is transfer-molded with a seal tape attached to the back of the radiator plate 37 during a resin encapsulation process step as will be described later. Thus, it is possible to prevent the resin encapsulant 38 from overflowing to reach the back of the radiator plate 37 and forming resin bur thereon. Accordingly, the radiating face (back surface) of the radiator plate 37 can maintain it function. That is to say, its function of dissipating the heat, which has been generated from the semiconductor chip of the semiconductor device, to the outside can be maintained and improved.

Next, a method for manufacturing the resin-molded semiconductor device of this embodiment will be described with reference to the drawings. FIGS. 14 through 18 are cross-sectional views illustrating, on a step-by-step basis, a manufacturing process for the resin-molded semiconductor device including a radiator plate according to this embodiment.

Figure 14:
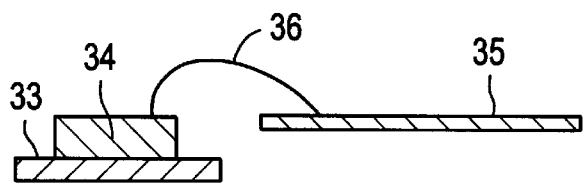
FIG. 14 is a cross-sectional view illustrating the process step of preparing a leadframe during a manufacturing process of the resin-molded semiconductor device in the third embodiment.

First, in the process step shown in FIG. 14, a lead-frame, including the bed 33, or a support for a semiconductor chip, and the metal terminal 35, is prepared. The semiconductor chip 34 is bonded onto the upper surface of the bed 33 with a die-bonding member. Then, the semiconductor chip 34 is connected to the metal terminal 36 with the metal fine wire 36.

Figure 15:
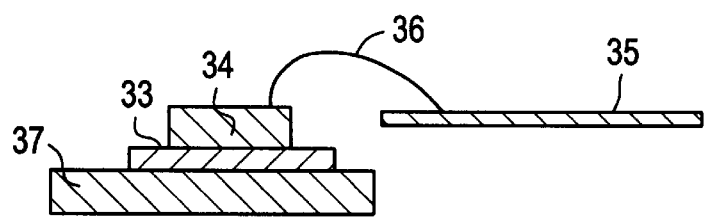
FIG. 15 is a cross-sectional view illustrating the process step of bonding a semiconductor chip onto a radiator plate and forming metal fine wires during the manufacturing process of the resin-molded semiconductor device in the third embodiment.

Next, in the process step shown in FIG. 15, the radiator plate 37 is bonded onto the back of the bed 33. Alternatively, the bed 33 may also be formed with an increased thickness so as to function as a radiator plate by itself.

Figure 16:
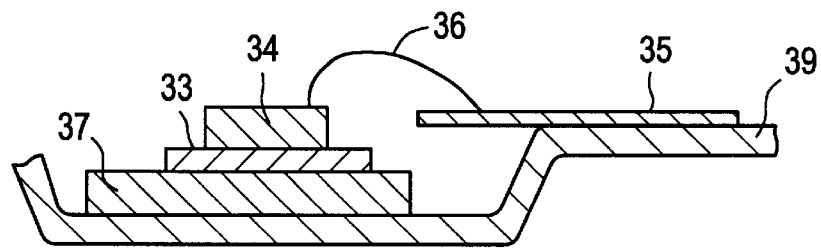
FIG. 16 is a cross-sectional view illustrating the process step of placing a seal tape under the radiator plate and the leadframe during the manufacturing process of the resin-molded semiconductor device in the third embodiment.

Then, in the process step shown in FIG. 16, the seal tape 39 is adhered to the back of the radiator plate 37. In this case, the radiator plate 37 with the seal tape 39 adhered thereto may be placed into a molding die assembly. Alternatively, the back of the radiator plate 37 may be adhered to the seal tape 39 by attaching in advance the seal tape 39 to the molding die assembly, more specifically onto the lower die, and then mounting the radiator plate 37 onto the lower die.

Figure 17:
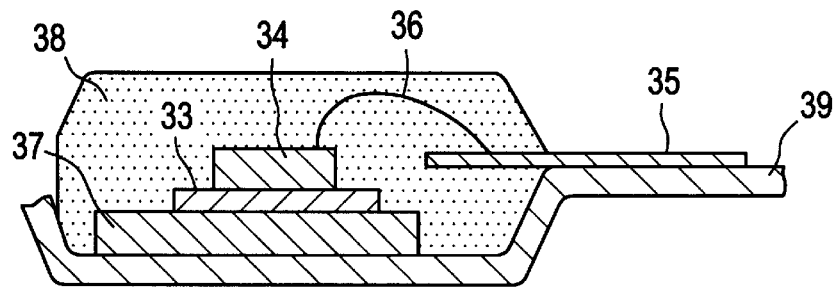
FIG. 17 is a cross-sectional view illustrating a resin encapsulation process step during the manufacturing process of the resin-molded semiconductor device in the third embodiment.

Subsequently, in the process step shown in FIG. 17, the bed 33, semiconductor chip 34, metal fine wire 36 and part of the metal terminal 35 are molded with the insulating resin encapsulant 38 while the seal tape 39 is adhered to the back of the radiator plate 37. In this case, the bottom of the radiator plate 37 and the other part of the metal terminal 35 are exposed out of the resin encapsulant 38.

Figure 18:
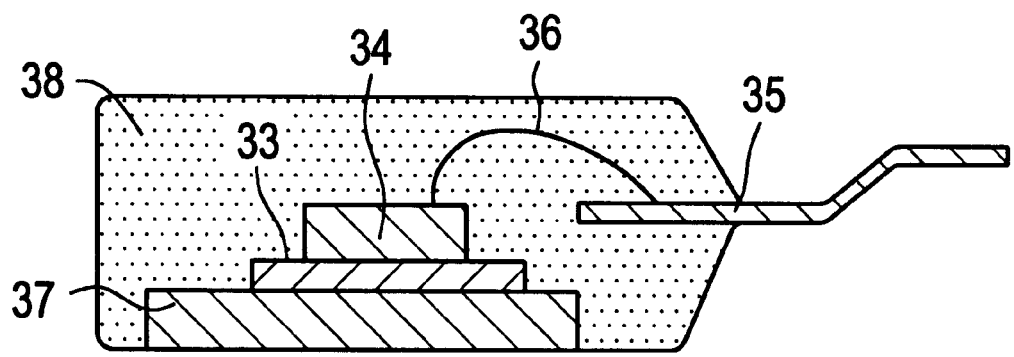
FIG. 18 is a cross-sectional view of the resin-molded semiconductor device after the seal tape has been removed during the manufacturing process of the resin-molded semiconductor device in the third embodiment.

Finally, in the process step shown in FIG. 18, the seal tape 39 is peeled off from the back of the radiator plate 37 and the metal terminal 35 is folded, thereby completing a resin-molded semiconductor device shown in FIG. 18, in which the back of the radiator plate 37 is exposed.

In the method for manufacturing the resin-molded semiconductor device including a radiator plate according to this embodiment, the seal tape 39, which is adhered to the back of the radiator plate 37, is used during the resin encapsulation process step, thereby preventing the overflow of the resin encapsulant onto the back of the radiator plate 37 and the formation of resin bur thereon. In other words, since the back of the radiator plate 37 can be exposed without fail, a resin-molded semiconductor device can be obtained without lessening the radiation effect of the radiator plate 37. Also, since the resin encapsulation is performed with the seal tape 39 adhered to the back of the radiator plate 37, part of the seal tape 39 is forced inward to partially cover the sides of the radiator plate 37. As a result, the radiator plate 37 slightly protrudes out of the back of the resin encapsulant after the resin encapsulation is over. Accordingly, in mounting such a resin-molded semiconductor device onto a motherboard, the entire back surface of the radiator plate 37 can be in contact with the motherboard without fail, thus enhancing the radiation effect.

EMBODIMENT 4

Figure 19:
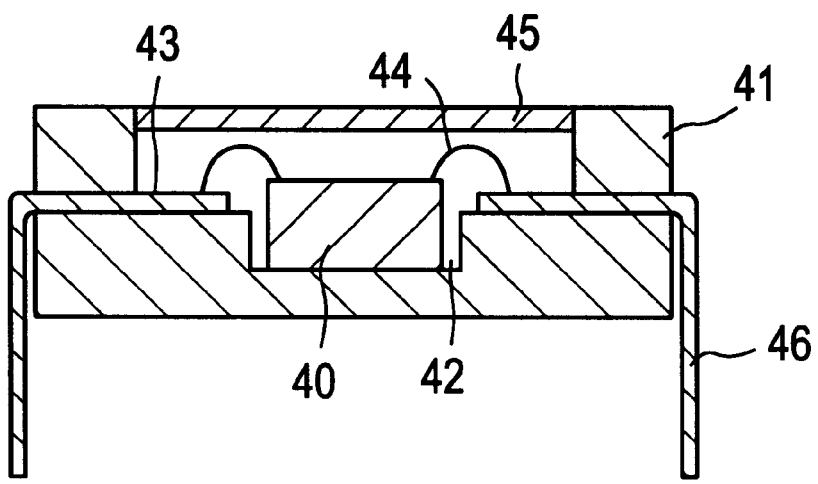
FIG. 19 is a cross-sectional view of a resin-molded semiconductor device as a CCD package according to a fourth embodiment of the present invention.

Next, a fourth embodiment of the present invention will be described with reference to the drawings. FIG. 19 is a cross-sectional view illustrating a resin-molded semiconductor device, like a CCD package, according to this embodiment.

As shown in FIG. 19, the resin-molded semiconductor device of this embodiment includes: a resin package 41 with an opening in the upper part thereof and a recess 42 provided within the opening; a solid-state imaging device 40 bonded onto the bottom of the recess 42 of the resin package 41 with a die-bonding member; inner leads 43 provided near the recess 42 of the resin package 41; outer leads 46, which are connected to the respective inner leads 43 and extend outward through the resin package 41; and metal fine wires 44 for electrically connecting electrode pads (not shown) on the solid-state imaging device 40 to the inner leads 43 on the resin package 41. Also, the opening of the resin package 41 is sealed with sealing glass 45. The outer leads 46, protruding out of the resin package 41, are folded downward. It should be noted that the resin package 41 is a package that has been integrally transfer-molded with an insulating resin.

In the resin-molded semiconductor device according to this embodiment, the resin package 41 is formed by performing transfer-molding with a seal tape attached onto the inner leads 43 during a resin encapsulation process step as will be described later. Thus, no resin bur is formed on respective upper surfaces of the inner leads 43, but these surfaces are exposed. Accordingly, in this resin-molded semiconductor device, the inner leads 43 can be connected to the solid-state imaging device 40 via the metal fine wires 44 with more reliability.

Figure 20:
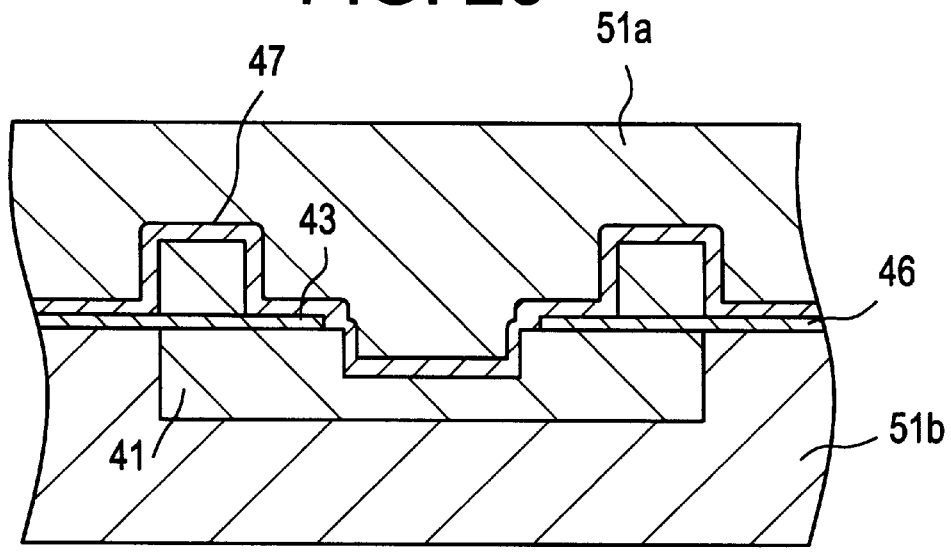
FIG. 20 is a cross-sectional view illustrating a resin encapsulation process step during a manufacturing process of the resin-molded semiconductor device in the fourth embodiment.
Figure 21:
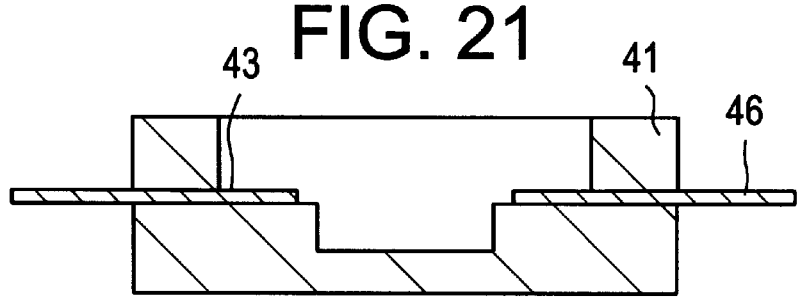
FIG. 21 is a cross-sectional view illustrating the process step of removing a seal tape after the resin encapsulation during the manufacturing process of the resin-molded semiconductor device in the fourth embodiment.
Figure 22:
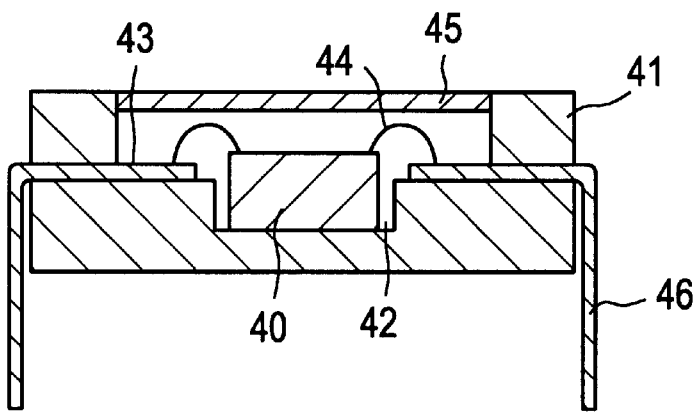
FIG. 22 is a cross-sectional view illustrating the process step of forming metal fine wires and sealing with seal glass during the manufacturing process of the resin-molded semiconductor device in the fourth embodiment.
Figure 23A:
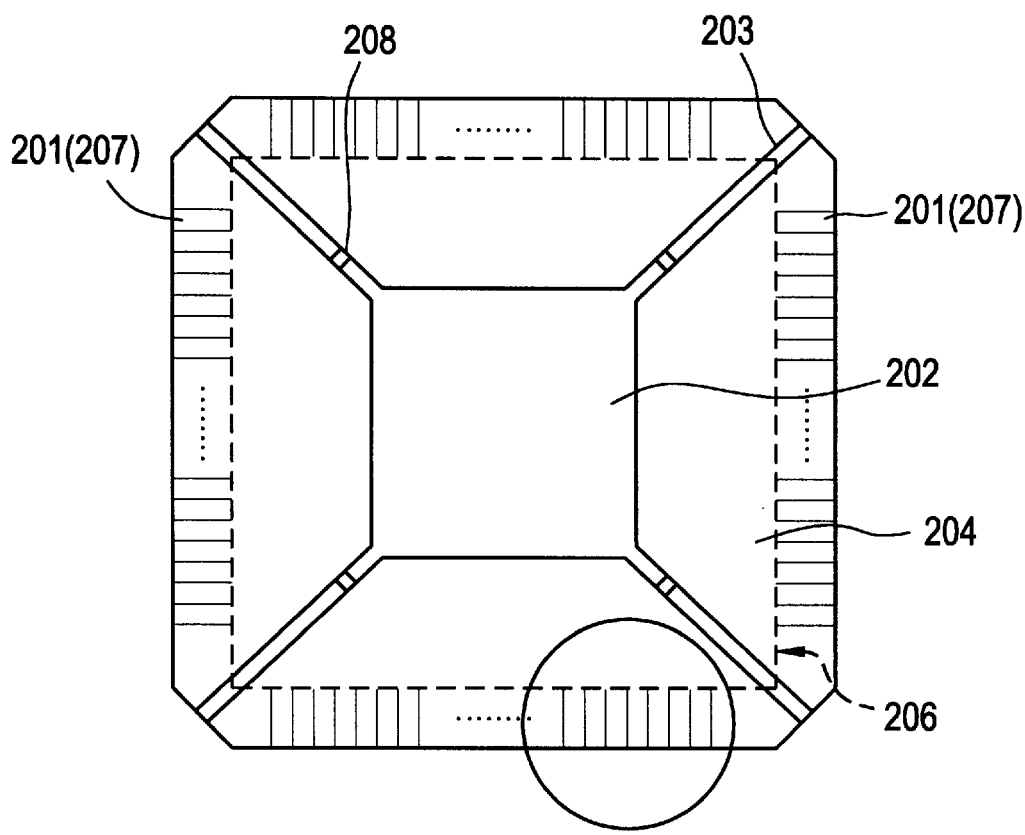
FIGS. 23(a) and 23(b) are respectively plan view and cross-sectional view of a conventional resin-molded semiconductor device of the type including external electrodes on its back.
Figure 23B:
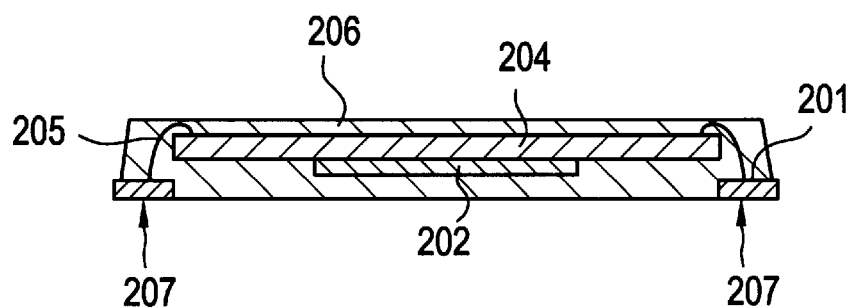
Figure 24:
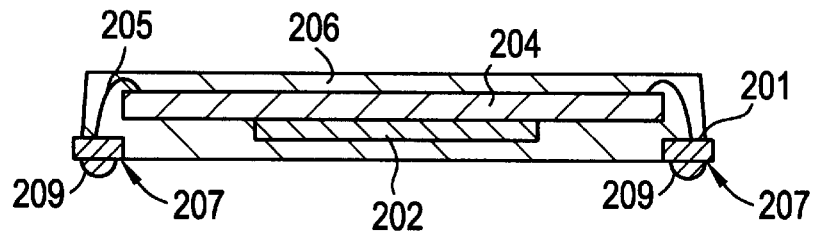
FIG. 24 is a cross-sectional view of a conventional resin-molded semiconductor device ensuring a standoff height by providing ball electrodes for the external electrodes.
Figure 25:
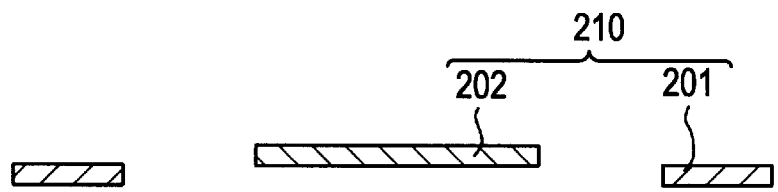
FIG. 25 is a cross-sectional view illustrating the process step of preparing a leadframe during a conventional manufacturing process of the resin-molded semiconductor device.
Figure 26:
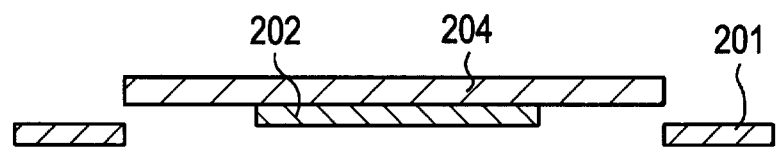
FIG. 26 is a cross-sectional view illustrating the process step of bonding a semiconductor chip onto a die pad during the conventional manufacturing process of the resin-molded semiconductor device.
Figure 27:
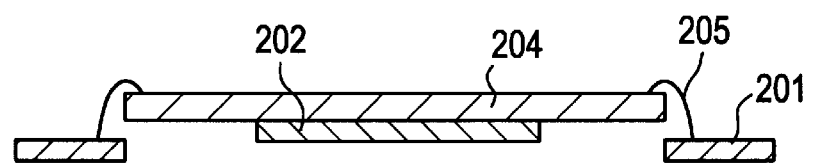
FIG. 27 is a cross-sectional view illustrating the process step of forming metal fine wires during the conventional manufacturing process of the resin-molded semiconductor device.
Figure 28:
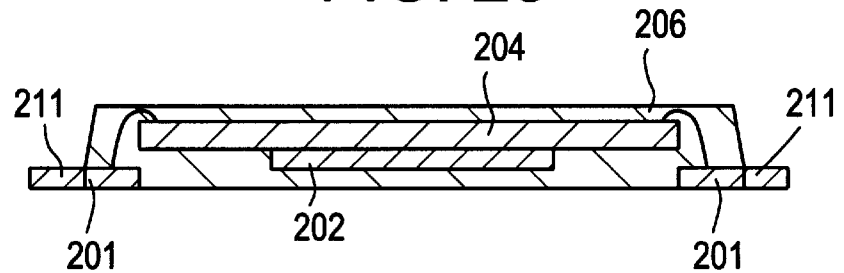
FIG. 28 is a cross-sectional view illustrating a resin encapsulation process step during the conventional manufacturing process of the resin-molded semiconductor device.
Figure 29:
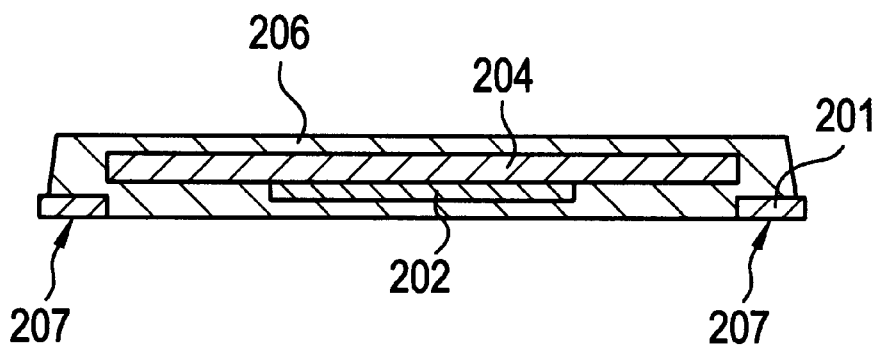
FIG. 29 is a cross-sectional view of the resin-molded semiconductor device after the resin encapsulation during the conventional manufacturing process of the resin-molded semiconductor device.
Figure 30:
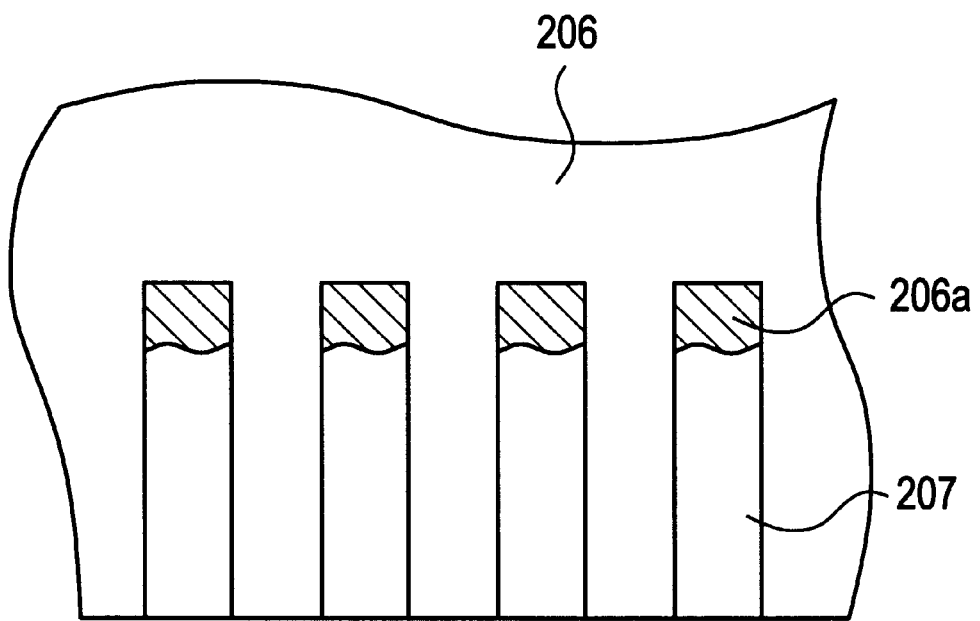
FIG. 30 is a bottom view of the resin-molded semiconductor device formed by the conventional manufacturing process of the resin-molded semiconductor device.

Next, a method for manufacturing the resin-molded semiconductor device according to this embodiment, like a CCD package, will be described with reference to the drawings. FIGS. 20 through 22 are cross-sectional views illustrating, on a step-by-step basis, a manufacturing process for the resin-molded semiconductor device according to this embodiment.

First, in the process step shown in FIG. 20, a lead assembly, including inner and outer leads 43 and 46, is prepared. Before the resin package is molded, the seal tape 47 is attached or adhered to those portions of the lead assembly to be the inner leads 43, thereby preventing the overflow of the resin encapsulant onto the upper surfaces of the inner leads 43. Then, the respective members are transfer-molded with a resin within a molding die assembly consisting of upper and lower dies 51a and 51b, thereby forming the resin package 41. FIG. 20 illustrates a state where the resin package 41 has already been formed and the respective surfaces of the inner and outer leads 43 and 46 are covered with the seal tape 47.

Then, in the process step shown in FIG. 21, the seal tape 47 is peeled off, thereby obtaining a resin package 41, in which the respective upper surfaces of the inner leads 43 are exposed without fail. At an elevated temperature, the seal tape 47 adheres to the inner leads 43 without forming any gap therebetween. Thus, on the exposed surfaces of the inner leads 43, from which the seal tape 47 has been peeled off, no foreign particles, such as resin bur of the resin encapsulant, are deposited.

Subsequently, in the process step shown in FIG. 22, the solid-state imaging device 40 is bonded onto the bottom of the recess 42 provided within the resin package 41. Electrode pads on the solid-state imaging device 40 are connected to the inner leads 43 with the metal fine wires 44. After the opening of the resin package 41 has been sealed with the sealing glass 45, the outer leads 46 are folded. The outer leads 46 may be folded into a desired shape depending on the type of the semiconductor device.

A resin encapsulation technique using a seal tape according to this embodiment is particularly suitable for manufacturing a semiconductor device including a resin package with an opening in the upper part thereof, e.g., an optical semiconductor device like a CCD or a hologram. In particular, remarkable effects can be attained if this embodiment is applied to molding a resin package including leads.

Another application of this embodiment will be briefly described. In manufacturing a component, such as an LED, the package of which should have required color or transparency, resin encapsulation can be performed effectively by attaching a seal tape to a molding die assembly in advance such that foreign particles or dirt involved with the molding die assembly are not transferred to the package. As a result, an excellent package can be formed.

Industrial Applicability

The resin-molded semiconductor device and the method for manufacturing the same according to the present invention are applicable to all sorts of electronic equipment using a semiconductor integrated circuit made up of various types of transistors.

What is claimed is:

1. A method for manufacturing a resin-molded semiconductor device, characterized by comprising:

a first step of preparing a leadframe, the leadframe including: inner leads; a die pad with externals smaller than those of a semiconductor chip to be mounted thereon; and support leads for supporting the die pad, each said support lead being provided with a stepped portion for elevating the die pad above the inner leads;

a second step of bonding the semiconductor chip onto the upper surface of the die pad of the leadframe;

a third step of bonding the semiconductor chip onto the upper surface of the die pad of the leadframe;

a third step of connecting the semiconductor chip to the inner leads with metal fine wires after the second step has been performed;

a fourth step of placing a seal tape between a molding die assembly and the leadframe such that the seal tape adheres only to the back surface of the inner leads after the third step has been performed, a fifth step of encapsulating using a resin encapsulant with respective tips of the inner leads of the leadframe pushed downward to press a surface of the seal tape, which is in contact with respective back surfaces of the inner leads, against the die assembly and thereby force the inner leads into the seal tape, after the fourth step has been performed; and a sixth step of removing the seal tape to protrude respective lower parts of the inner leads out of the resin encapsulant and thereby form external electrodes after the fifth step has been performed.

2. The method for manufacturing a resin-molded semiconductor device of claim 1, characterized in that in the first step, the leadframe prepared has been plated with metal layers of nickel (Ni), palladium (Pd) and gold (Au).

3. The method for manufacturing a resin-molded semiconductor device of claim 1, characterized in that in the second step, the seal tape attached has such a thickness as corresponding to a desired value, which is equal to a height of lower surfaces of the inner leads protruding downward from the back surface of the resin encapsulant after the resin encapsulation.

4. The method for manufacturing a resin-molded semiconductor device of claim 1, characterized in that in the fifth step, encapsulation is performed so that the resin encapsulant covers the back surface of the die pad.

5. A method for manufacturing a resin-molded semiconductor device, characterized by comprising:

a first step of bonding a semiconductor chip onto the supper surface of a substrate, the upper surface of the substrate being provided with interconnects, the back surface of the substrate being provided with external electrodes;

a second step of electrically connecting the semiconductor chip to the interconnects on the upper surface of the substrate with metal fine wires;

a third step of placing a seal tape between a molding die assembly and the substrate such that the seal tape adheres only to the back surface of the substrate after the second step has been performed;

a fifth step of encapsulating using a resin encapsulant with the substrate pushed downward to press a surface of the seal tape, which is in contact with the back surface of the substrate, against the die assembly and thereby force at least part of the external electrodes of the substrate into the seal tape, after the third step has been performed; and a sixth step of removing the seal tape after the fifth step has been performed.

6. The method for manufacturing a resin-molded semiconductor device of claim 5, characterized in that in the fifth step, encapsulation is performed so that the resin encapsulant covers the back surface of the die pad.

7. A method for manufacturing a resin-molded semiconductor device, characterized by comprising:

a first step of bonding a semiconductor chip onto the upper surface of a bed of a support member, the support member including leads and the bed;

a second step of bonding a radiator onto the back surface of the bed of the support member;

a third step of electrically connecting the semiconductor chip to the leads;

a fourth step of adhering a seal tape to the back surface of the radiator after the third step has been performed;

a fifth step of encapsulating using a resin encapsulant with the support member pushed downward to press a surface of the seal tape, which is in contact with the back surface of the radiator, against a die assembly and thereby force the back surface of the radiator into the seal tape, after the fourth step has been performed; and a sixth step of removing the seal tape after the fifth step has been performed.

8. The method for manufacturing a resin-molded semiconductor device of claim 7, characterized in that in the fifth step, encapsulation is performed so that the resin encapsulant covers the back surface of the die pad.

* * * * *